United States Patent [19]

King

[11] Patent Number: 4,901,004

[45] Date of Patent: Feb. 13, 1990

[54] APPARATUS AND METHOD FOR MAPPING THE CONNECTIVITY OF COMMUNICATIONS SYSTEMS WITH MULTIPLE COMMUNICATIONS PATHS

[76] Inventor: Fred N. King, 1930 Lake Port Way, Reston, Va. 22091

[21] Appl. No.: 282,133

[22] Filed: Dec. 9, 1988

[51] Int. Cl.$^4$ .................... H04M 3/22; G01R 31/02
[52] U.S. Cl. ........................ 324/66; 379/10; 379/25; 340/825.04
[58] Field of Search ........... 340/825.04, 825.36, 340/825.49; 324/66; 379/25, 26, 29, 31, 10; 370/14, 15, 58, 86, 88

[56] References Cited

U.S. PATENT DOCUMENTS

| | | |
|---|---|---|
| 2,873,321 | 2/1959 | Lindstrom et al. . |
| 3,004,105 | 10/1961 | Gordale et al. . |
| 3,287,509 | 11/1966 | Bohnenblust . |
| 3,601,561 | 8/1971 | Bennett . |
| 3,663,796 | 5/1972 | Boatwright et al. . |
| 3,681,686 | 8/1972 | Connally .............................. 324/66 |
| 3,699,274 | 10/1972 | Bennett . |
| 3,742,350 | 6/1973 | White . |
| 3,891,811 | 6/1975 | Miller ................................... 324/66 |
| 3,902,026 | 8/1975 | Rogers et al. ........................ 324/66 |
| 4,054,759 | 10/1977 | McGrath et al. . |
| 4,143,250 | 3/1979 | Simokat . |
| 4,204,094 | 5/1980 | Cepelinski . |
| 4,384,249 | 5/1983 | Medina . |
| 4,394,543 | 7/1983 | Keiper, Jr. et al. . |
| 4,434,328 | 2/1984 | Fields . |
| 4,445,086 | 4/1984 | Bulatao . |
| 4,456,790 | 6/1984 | Soyack . |
| 4,521,643 | 6/1985 | Dupuis . |
| 4,550,225 | 10/1985 | Lynch et al. . |
| 4,578,636 | 3/1986 | Bakke et al. ......................... 324/66 |
| 4,620,282 | 10/1986 | Shelley ................................. 324/66 |
| 4,626,633 | 12/1986 | Ruehl et al. . |
| 4,734,638 | 3/1988 | Weber ................................... 324/66 |
| 4,748,402 | 5/1988 | Sellati ................................... 324/66 |

*Primary Examiner*—Palmer C. DeMeo
*Assistant Examiner*—E. O. Pudpud
*Attorney, Agent, or Firm*—Sughrue, Mion, Zinn, Macpeak & Seas

[57] ABSTRACT

An apparatus and method, using a computer, for the efficient generation of a wiring map of the connectivity between two sets of terminals at different locations which have established communication links between respective terminals at the two locations. A single at a first location uniquely identifies each of the terminals, by code, frequency, sequence of connection or the like, and is transmitted to a respective terminal at the second location via a respective communication link. The terminals at the second location are sampled and the presence of the transmitted signal correlated to the identity of the first terminal. The correlation may be direct, as by unique terminal identifier, or by a comparison of data bases stored by computers. The computer-based correlation is used to generate a map of the limited terminals.

16 Claims, 3 Drawing Sheets

APPARATUS AND METHOD FOR MAPPING THE CONNECTIVITY OF COMMUNICATIONS SYSTEMS WITH MULTIPLE COMMUNICATIONS PATHS

FIELD OF THE INVENTION

This invention generally relates to an apparatus and method for the efficient generation of a map of the connectivity between two or more sets of points which have established communication paths between them. In particular the invention relates to the management of wiring and other communications media commonly used in buildings, office parks and campuses for telephone, data and video communications.

DESCRIPTION OF BACKGROUND ART

In many office buildings, when new tenants move in or the communications requirements of existing tenants change, new communications wiring is installed. New wiring is preferred in many cases despite the existence of already installed wiring which could meet the new requirements and despite the significant expense involved in installing new wiring. One reason that new wiring is often installed is that records identifying the termination points of the existing wiring frequently do not exist or, if such records have been established, their current accuracy is questionable. This problem has become exacerbated by the divestiture of the Bell system, which previously managed this record keeping function, and the assumption of wiring management responsibilities by building owners and tenants. Often, such owners or tenants do not have the skill or the facilities to satisfactorily perform this management function.

The task of identifying the termination points at remote building locations with terminals in a central wiring closet and, thus, the communication paths between them may be considered as a point mapping problem within a given topology.

The general topology for two sets of such points is shown in FIG. 1. Communications paths 3 connect the set of points 1 with the set of points 2. Such paths could be, for example, wires, coaxial cables, optical fibers or optical beams. Each set of points 1 and 2 may be physically dispersed or partially or completely centralized. In addition, each set of points may be either intermediate or end terminations of the paths 3.

Traditional means for mapping the connectivity between points 1 and 2 when the paths 3 are telephone lines, such as those installed in commercial buildings, have involved a tone generator, a telephone receiver and two technicians. The first technician connects the tone generator to one of the points 1. The second technician sequentially connects and disconnects the telephone receiver to each of the points 2 until the tone generator signal is heard. The second technician then communicates, typically through an auxiliary communictions channel such as a hand held radio, that he has acquired the tone and requests that the first technician identify the current physical location (such as a room number) of the tone generator. The second technician then typically labels the particular point 2 at which the tone was heard with the physical location information supplied by the first technician. The first technician then moves to the next point 1 and repeats the process. The labels thereby generated are the equivalent of a map of the connectivity between points 1 and 2.

An improvement to this traditional method may be seen in U.S. patent application Ser. No. 174,280 (King), entitled METHOD AND APPARATUS FOR MAPPING COMMUNICATIONS MEDIA, filed Mar. 25, 1988 and assigned to the assignee of the present invention, whose teachings are incorporated herein by reference.

In the described method an apparatus of the referenced application, as seen with reference to FIG. 1, a first apparatus is connected at points 1 and has some detectable characteristic for identifying the physical location of such apparatus. The preferred embodiment discussed in that application contemplated a temporary or permanent, but separate, apparatus for each of points 1, each such apparatus being operative to generate a code or signal uniquely related to such respective point; the unique code signal being correlated in a data base with the respective point. A second apparatus is connected temporarily or permanently to points 2 and detects such characteristic of the first apparatus connected at points 1. It has a structure for identifying the physical location of specific points 2 where the specific characteristic of points 1 are detected. A third apparatus employs a process which correlates information about the physical location of the first apparatus connected to points 1 with the physical locations of the specific connections at points 2 at which the characteristics of the first apparatus at points 1 are detected such that the connectivity between the physical locations of points 1 and points 2 can be determined.

As described therein, the first apparatus connected at points 1 typically comprises plural sources of unique identifiers for each such point. Such identifiers can comprise different impedances or distinctive waveforms such as different frequencies or amplitudes or uniquely modulated or coded analog or digital signals.

The second apparatus connected at points 2 consists of one or more detectors of the unique identifiers employed by the first apparatus connected at points 1.

Finally, there is a third apparatus to record the particular points 2 at which a particular unique identifier was detected. The second apparatus may optionally include a switch or switches which sequentially connect a single detector to each of the points 2 or a switch or switches which sequentially connect the outputs of multiple detectors to a single data storage device. A further variation is the use of a switch or switches which sequentially connect multiple data storage devices to a single storage device.

The method disclosed in the referenced application, comprises three basic steps. Step 1 is to record in a first intermediate data base the relationship between unique identifiers and physical locations at point 1. For example, if the unique identifier is frequency and if room number 525 is a particular location of points 1 where apparatus which generates a frequency of 10 KHz has been connected, then this and each other such relationship are recorded.

Step 2 of the method consists of recording in a second intermediate data base and relationships between the unique identifiers detected at points 2 and the particular points 2 at which they were detected. For example, points two could be terminal blocks of an intermediate distribution frame for telephone wiring in a commercial building. If, as in the previous example, the unique identifier at points 1 is frequency and if 10 KHz was detected at pin pair 5–6 of terminal block A, then this information is recorded together with the particular frequencies detected at each other particular in pair.

Step 3 of the method consists of correlating the information recorded in step 1 with the information recorded in step 2 such that the connectivity between the specific physical locations of points 1 and the specific physical locations of points 2 is generated as a third mapping data base. Using the previous example, the unique identifier frequency of 10 KHz is a common element of step 1 and step 2. Step 3 produces the result that room 525 is connected to pin pair 5–6 of terminal block A. This result is one element of the desired map of the connectivity between points 1 and 2.

Since the preferred embodiment of the referenced application employs unique identifiers at each first location 1, the cost of implementing the system may be undesirably high, depending on the number of remote points being mapped. Moreover, the method of the preferred embodiment contemplates the creation of a first data base relating the unique identifier to each particular point 1 and a second data base relating the unique identifier to a particular point 2.

Accordingly, it is an object of the present invention to implement a mapping method and apparatus without a unique identifier apparatus at each first location.

It is a further object to implement a mapping method and apparatus with only a single unique identifier apparatus for plural first locations.

It is another object of the present invention to implement a mapping method and apparatus without generating a first intermediate data base that relates each unique identifier to a particular point 1.

It is also an object of the present invention to implement a mapping method and apparatus that directly relates each point 1 and point 2 identifiers, without generating either a first or second intermediate data base.

SUMMARY OF THE INVENTION

The present invention is characterized by the use of an identifier from a single source that is sequentially connected to each of the first points and a device to record the unique code or signal for each point, or even the sequence in which, or time at which, such connections or activations are made. Where sequence or time of connection is the distinguishing characteristic, such an identifier may, but need not have, a unique characteristic for each point and can be an impedance (including a short or an open circuit), a distinctive waveform such as a frequency or amplitude or a modulated or coded analog or digital signal. The apparatus connected at the second points consists of one or more detectors of the identifier and a means to record the particular second point at which the identifier is detected. The apparatus also may record a characteristic of the identifier or the sequence in which, or the time at which, such detection occurs.

In one embodiment, a first intermediate data base correlating each first point and each identifier is utilized and combined with a second intermediate data base correlating each second point and each identifier in generating the connection map.

In another embodiment, the identifier uniquely identifies each first point, as by encoded number, while the corresponding second point is uniquely identified by a non-coded number. The connectivity map is generated using an intermediate data base to decode the number identifying the first point, but the non-coded number is used directly, without the need for an intermediate data base.

In a further embodiment, the identifiers specifically identify jack or room and contact numbers and the connectivity map is generated directly, without the need for a first or second intermediate data base.

DESCRIPTION OF THE PREFERRED EMBODIMENTS

Figure 1:
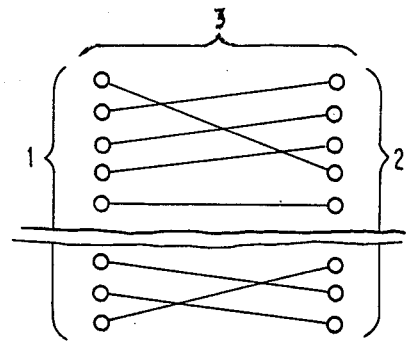
FIG. 1 is an illustration of a communications topology to which the present invention applies.

The method of one embodiment of the present invention is comprised of three basic steps.

Step 1 is to record the relationship between the unique signal or code generated for each specific first point 1 by a common generator operative to output a plurality of unique signals or codes. Alternatively, the sequence in which or time at which a single signal or code identifier is connected to or activated at specific first points 1 together with the associated physical locations of such specific first pints is recorded. For example, the identifier (in this instance, non-unique) could be the carrier frequency of the modem 8 of FIG. 2. If room 525 is the second connection of this identifier, then the sequence number 2 would be recorded as associated with this room number. Optionally, the time of such connection—e.g., 10:21 AM, could be recorded.

Step 2 of the process consists of a similar recording of the unique signal or code at the specific second points 2 and the specific physical locations of such specific second points 2. Alternatively, the second step can comprise the recording of the relationship between the sequence in which, or the time at which connection or activation of the identifier at first points 1 is detected at a specific second point 2 and the specific physical locations of such specific second point 2. For example, if the second instance of detecting the carrier frequency of the modem 8 of FIG. 2 at second points 2 is detected at pin pair 5–6 of terminal block A of an intermediate distribution frame, then such relationship is recorded. A similar recording is made for each other such detection. Optionally, the time of such detection, e.g., 10:21 AM for the particular pin pair 5–6, could be recorded, as would a similar relationship between time of detection and the identity of other pin pairs.

Step 3 of the process consists of correlating the information recorded in step 1 with the information recorded in step 2 such that the connectivity between specific first points 1 and specific second points 2 is generated. Continuing the previous example, either by noting the common code or signal, the common sequence number 2 or the common time 10:21 AM, step 3 produces the result that room 525 is connected to pin pair 5–6 of terminal block A. Again, this is one element of the desired map of the connectivity between points 1 and 2.

Figure 2:
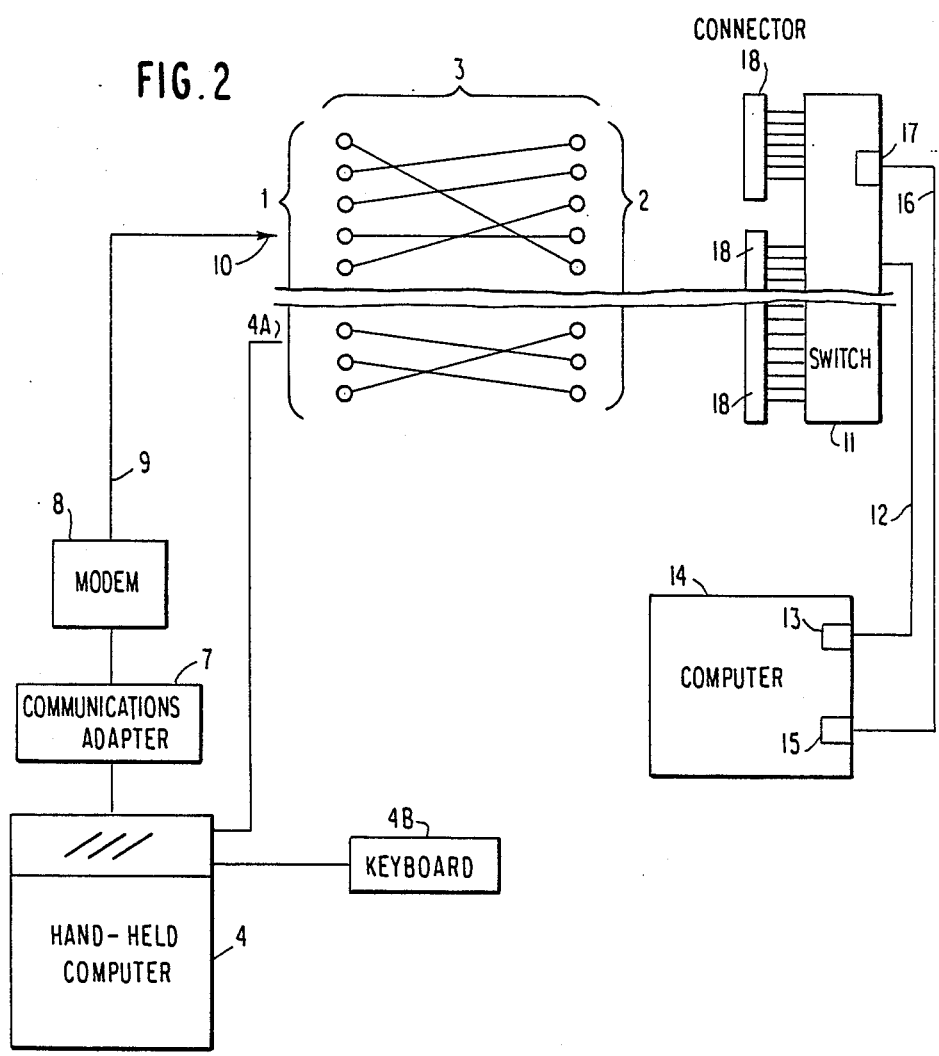
FIG. 2 is an illustration of an implementation of a preferred embodiment of the present invention.

The preferred embodiment of the invention for application to mapping telephone wiring in commercial buildings is the configuration shown in FIG. 2. The first points 1 can, in this case, be dispersed telephone jacks that are connected to the second points 2, which can be pin pairs on terminal blocks in a distribution frame. The communications paths 3 will typically be twisted pair wires. A hand held computer 4, which can be a PSION Organizer XP manufactured by PSION Limited of London, England, is connected to a communications adapter 7, which can be PSION Comms Link also manufactured by PSION Limited. The computer 4 may have an input from a light pen 4A, which can read a uniform bar code signal from a room or jack identifier plate, or from a keyboard 4B upon operator activation, as further disclosed herein. The communcations adapter 7 is connected to a standard portable modem 8 such as a Migent Pocket Modem, manufactured by Migent, Inc. of Incline Village, Nev. The modem transmits a carrier at a first frequency f1. A standard telephone line cord 9 with an industry standard RJ11 jack 10 can be used to sequentially connect to the telephone jacks 1. At the distribution frame, one or more multi-pin connectors 18 such as a TAP-50 manufactured by Siemon Company of Watertown, Conn. are connected to a sequential switch 11 which can be an electro-mechanical stepping switch or its electronic equivalent. The number of inputs to the sequential switch can be arbitrarily large although 100 will typically be adequate. The position of the sequential switch 11 is controlled by signals received at its control port 17 over cable 16 from the serial port 15 of the microcomputer 14. The output of the sequential switch 11 is connected to the internal modem 13 of a standard microcomputer 14 by a cable 12. The modem receives the carrier signal transmitted at frequency f1 and transmits a carrier at a second frequency f2. Since f2 is different from f1, their concurrent transmission on a line in different directions is permitted. This two frequency handshake can be used by the computers to establish that a connection currently exists.

Figure 3:
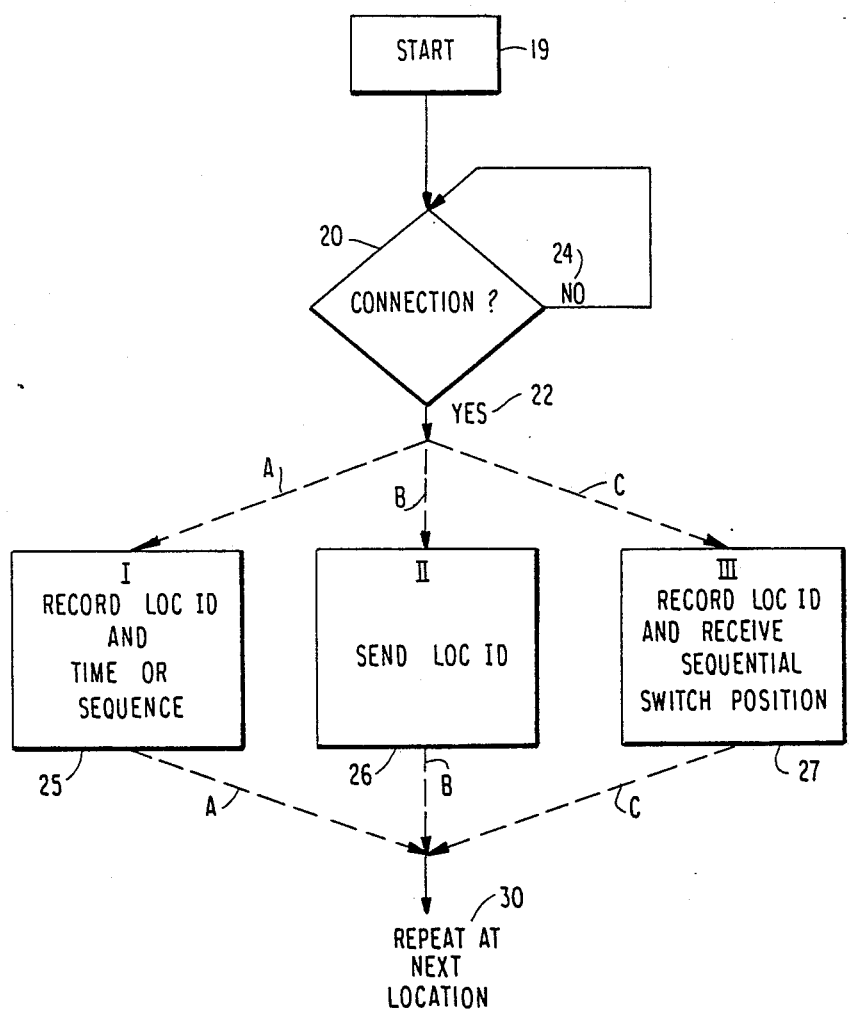
FIG. 3 is a flow chart of an program that may be used by a hand held computer in connection with the present invention.
Figure 4:
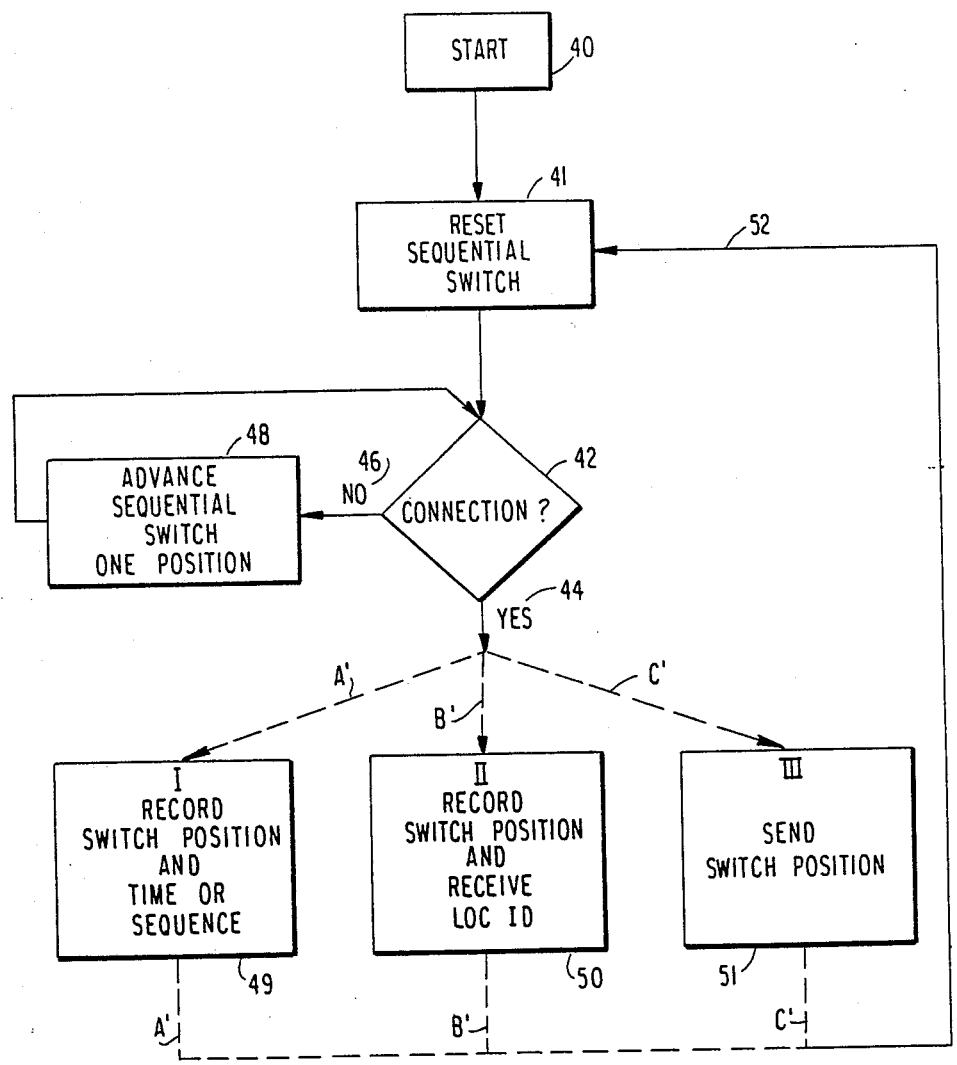
FIG. 4 is a flow chart of a program that may be used by a microcomputer in connection with the present invention.

FIG. 3 shows a flow chart of a computer program used in the hand held computer 4. First, the telephone at the first point or location 1 is temporarily disconnected and the jack 10 connected in its place by an operator. At Step 19, a program is initiated at a START position. After initiation of the program at Step 19, the carrier at frequency f1 is continuously transmitted from the connection point 1 by modem 8 and a check is made in Step 20 for the presence of a carrier signal at frequency f2 from the microcomputer's modem 13. If such signal is not detected (Step 24), the check is repeated until such signal is detected (Step 22). Upon such detection, the hand held computer could provide a "READY" signal to the operator. At this point the computer 4 is set to operate in a manner that will result in the recording of an identifer of a first point or location 1, such as a room number. The computers 4 and 14 could be programmed to employ any of three different data recording methods. For convenience all three are shown in FIGS. 3 and 4, however it will be recognized by one of ordinary skill in the art that the system can be programmed to use any one or more of these methods. If more than one is programmed, the operator would need to choose one of the methods and would select the appropriate algorithms at the hand held unit 4 and the central unit 14.

In the first method, whose operative path A is followed after a connection between the central and remote computers is established (Step 22), algorithm I is utilized (Step 25). The computer 4 may be programmed to request entry of the local identifier by the operator, via a keyboard or other manual switch, and to automatically record the time or sequence in which the identifier is entered into the memory of computer 4. The jack or room number together with the sequence (which is one for the first point or location 1) or the time of entry is recorded in the memory of hand held computer 4. The time or sequence subroutine is simple and need not be detailed. Upon subsequent input of a RESET command to the keyboard, the program is set to be repeated at the next jack. This process is then repeated (Step 30) at all remaining first points or locations 1. The result in the memory of computer 4 is a first data base of room number and corresponding sequence or time information. The use of this data base is discussed subsequently in connection with FIG. 4, algorithm I.

In the second method, whose operative path B is followed after a connection is established at Step 22, algorithm II is utilized (Step 26). The computer 4 may be programmed to request the recording of the local identifier by the operator. Each room or, preferably, each jack in the building can be assigned a particular alpha/numeric code. That code can be transmitted by an operator when he or she is present at the particular jack. The code can be read by the operator and, using the modem 8 of hand held computer 4, transmitted to the central computer 14. Alternatively, the code can be a bar-type code which is scanned by a light pen 4A attached to the hand held computer. The identifier need not be recorded locally in a first intermediate data base, but would be transmitted to the central computer 14, which operates on the received identifier in accordance with a corresponding algorithm II, as described with respect to FIG. 4. The transmission of the identifier may occur automatically, based on a delay following entry of the identifier into computer 4, or by a computer prompt to the operator requesting entry of a "SEND" command. The central computer may acknowledge receipt of the identifier by a return signal or receipt may be assumed. In either event, following transmission of the identifier, the operator moves to the next location (Step 20).

In the third method, identified by operative path C, algorithm III is utilized (Step 27). The computer 4 may be programmed to request the recording of the local identifer by the operator. That identifier would be stored in the memory of computer 4. The computer 4 is then set to await reception of a sequential switch identifier sent from the central computer 14. The computer 14 would be operative to identify the particular position of switch 11 connected to central terminals 2 as the switch cycles through each position. Clearly, under this arrangement, each terminal 2 would have transmitted across the line to which it is connected, only one unique identifier comprising the switch 11 position. The hand held computer 4 would record the received switch position and correlate that information with the terminal 1 identifier entered by the operator. Upon reception of the switch identifier, the hand held computer may signal the operator to proceed to the next terminal 1 (Step 30).

FIG. 4 shows a flow chart of the computer program used in the microcomputer 14. This program operates concurrently with the program of FIG. 3. Typically, a single operator will connect the computer 14 to the terminal block and initiate program operation prior to departing with the hand held computer for a survey of the telephone jacks at locations served by that terminal block, e.g. on a single floor of a building. After attachment to connector 18, the program is activated in step 40. As previously noted, modem 13 will transmit a carrier at frequency f2 toward points 1 each time switch 11 reaches a new point 2. In Step 42 the program begins to check at the first of second points 2 for the presence of a carrier signal at frequency f1 transmitted from the modem 8 attached to hand-held computer 4. If such signal is not present (Step 46), the stepping switch 11 is advanced (Step 48) to the next point 2 and Step 42 is repeated. This advance-one-step-and-check process is repeated (including starting over again) until the carrier signal f1 is detected (Step 44). At this point, one of three different algorithms, corresponding to the three data recording methods previously described with respect to the remote unit in accordance with FIG. 3, is implemented.

In the first method, which follows operative path A after a connection between the central and computers is confirmed (Step 44), algorithm I is utilized (Step 49). Upon detection of the carrier at frequency f1, the position of the stepping switch 11 is recorded in computer 14 memory during Step 49 together with the sequence or time of such detection. This process is then repeated in Step 42 until signals from all first points 1 have been detected and a second data base is formed in computer 14.

The results of the programs I described are two sets of data or data bases. One set, created by the program I of FIG. 3, relates first points or locations 1 to unique sequence numbers or unique points in time. The second set of data, created by the program II of FIG. 4, relates stepping switch positions—which have been known relationships to specific second points 2—to similar unique sequence numbers or unique points in time. Since unique sequence numbers or unique points in time are common to both sets of data, it follows that correlation of the two sets provides the desired set of relationships which described the connectivity between points 1 and points 2.

While the first preferred embodiment has been described in terms of a common identifier based on time or sequence of activities, this same approach is applicable to the use of a signal source, having a variable signal or code output, that is connectable to each of the first points 1.

In the second method of the invention, whose operative path B' is followed after a connection is established at Step 44, algorithm II is utilized (Step 50). The computer 14 may be programmed to record in memory the particular switch position (pin pair) at which the connection is established and the terminal 1 identifier that was transmitted over the carrier f1. Thus, a ready correlation of central pin pair and unique jack identifier is automatically created. This correlation may be stored in computer 14 memory and read out on command as a connection map.

In the third method, identified by operative path C', algorithm III is utilized (Step 51). The computer 14 may be programmed to transmit via carrier f2 a signal identifying the particular switch position (pin pair) at which the connection was established. The pin pair identifier is received by the hand held computer 4 and stored on its memory along with the jack identifier entered by the operator. Thus, a ready correlation of pin pair and unique jack identifier is automatically and directly created, without any intermediate data base. This correlation may be stored in computer 4 memory and read out on command as a connection map.

It would be within the skill of the routineer to modify the present invention in any of a number of ways to create bases at either or both of the first and second locations. The data bases may be identical at each location, as where a computer at the first location stores and transmits the first location identifier, the computer at the second location stores the received first location identifier and the receiving second location identifier, and the second location computer tranmits the second location identifier for reception and storage by the first location computer.

Further modifications to the system would involve the transmission of the identifier information by a separate path, e.g. radio link, without using the fixed connection between points 1 and 2.

In another modification, the existence of a connection need not be established and the point 1 identifier need not be transmitted for a fixed period of time sufficient for the switch at the second location to cycle completely through all of points 2. At the second location, a storage device at each of points 2 could retain the transmitted identifer for subsequent correlation.

These and other modifications could be implemented by one of ordinary skill in the art having read this present disclosure.

I claim:

1. A method, using computer means, of correlating the respective locations of a plurality of first terminals comprising communications jacks, connections and devices installed at first locations, each of said first terminals being connected by a communications medium to respective second terminals at a second location, comprising the steps of:
   generating a signal at each first terminal, transmitting each said signal from a sequence of respective first terminals to respective ones of said second terminals,
   recording first information correlating the sequence of said signal transmission and the location of each first terminal,
   detecting each said transmitted signal at each respective second terminal,
   identifying in said computer means the sequence in which said second terminals receive said signal with second information correlating the sequence of said signal detection and the location of said second terminals,
   comparing in said computer means said first information obtained in said recording step and said second information obtained in said identifying step to create a third information which correlates the physical location of each first terminal to the physical location of a corresponding second terminal, and
   providing a map of the communications medium which connects said first and second terminals.

2. The method of claim 1 wherein said transmission sequence is recorded as a function of time of the day.

3. The method of claim 1 wherein said generating step comprises generating from a common source a unique signal at each first location.

4. In a telecommunications system having first communications terminals at a plurality of first locations, second communications terminals at one or more second locations and communications media connecting a respective pair of first and second terminals, said system further comprising:

first location means connectable in a first sequence to each of said first terminals and operative to generate a signal at each first terminal for transmission via said communications media to said respective second terminal, to identify each said first terminal with said first sequence and to store said identity of said first terminals with said first sequence;

second location means connectable to said second communications terminals and operative to record a second sequence of second terminals in which said signal is received and the physical location of each second terminal on which said signal is received; and computer means for correlating the first sequence in which said signal generator means is connected to said first terminals and the second sequence in which said transmitted signal output is received at said second communication terminals; and means for generating a map comprising the identity of the location of each first communications point correlated to the identity of its corresponding second point whereby each of said second communication terminals may be identified with the physical location of each first communication terminal to which it is connected.

5. The system of claim 4 wherein said first location means further comprises a first data base means for generating a data base that identifies said first terminals with said first sequence in which said signal generator means is connected thereto and said second location means includes means for receiving said signal at each of said second communication terminals and generating a second data base identifying said second sequence in which each second communications terminal receives said signal.

6. The system of claim 5 further including a means for correlating said first and second data bases whereby the physical connections of said first and second terminals is obtained.

7. A method of correlating the respective locations of a plurality of first physically collocated terminals at a first physical location, each of said first terminals being identifiable by a respective one of a plurality of first unique identifiers and being connected by a communications medium to respective second terminals at second physically dispersed locations, each of said terminals being identifiable by a respective one of a plurality of second unique identifiers, comprising the steps of:

establishing the existence of a connection between a first terminal and a second terminal by said communications medium;

generating a unique signal at each first and second location, said signal comprising said first and second unique identifier, respectively;

transmitting each said first unique signal from said first terminals at said first location to a respective one of second terminals at a respective second location, detecting and storing said transmitted first unique identifier at said respective physically dispersed second location, correlating each said detected first unique identifier with said generated second unique identifier, and generating a map of the communications medium which connects terminals at said first and second locations, said map comprising the identity of said first physically collocated terminals and the identity of said physically disposed location of said second terminals.

8. The method of claim 7 wherein said unique identifiers comprise alpha/numerics.

9. The method of claim 8 wherein said alpha/numerics are encoded.

10. The method of claim 7 wherein said identifiers are correlated to physical locations of said first and second terminals.

11. Apparatus for correlating the respective locations of a plurality of first collocated terminals, each of said first terminals being identifiable by one of a plurality of first unique identifiers and being connected by a communications medium to respective second terminals at second physically dispersed locations, the physical location of each of said second terminals being identifiable by one of a plurality of second unique identifiers, comprising:

first means for generating a first unique signal at each first location, said signal comprising a first unique identifier;

means for transmitting each said first unique signal from its respective first terminal to a respective second terminal, means for detecting said transmitted first unique identifier at its respective second terminal, second means for generating a second unique signal at each second location, said second unique signal being related to said second unique identifer, and computing means storing said detected first unique identifier and for correlating each first unique identifier with said second unique identifier wherey a map is created of the physical location of each second terminal at which said first identifier was detected and the identity of the respective first terminal to which it is connected.

12. The apparatus of claim 11 wherein said second generating means comprises a scanner means.

13. The apparatus of claim 11 wherein said second generating means comprises a keyboard.

14. The apparatus of claim 11 wherein said first terminals comprise at least one of jacks, connections and devices installed at said first location.

15. The apparatus of claim 11 further comprising at said second location means for storing said detected unique identifier.

16. The apparatus of claim 11 further comprising at said second location means for generating a map of the connections between said first and second terminals.

* * * * *